(12) United States Patent
Hagerty

(10) Patent No.: US 10,248,157 B1
(45) Date of Patent: Apr. 2, 2019

(54) SAMPLE CLOCK SOURCE FOR DIGITAL DATA SYSTEMS

(71) Applicant: The United States of America as represented by the Secretary of the Navy, Washington, DC (US)

(72) Inventor: James D Hagerty, Tiverton, RI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/103,038

(22) Filed: Aug. 14, 2018

(51) Int. Cl.
| G06F 19/00 | (2018.01) |
| H03K 19/21 | (2006.01) |
| G06F 1/08 | (2006.01) |
| H03K 21/08 | (2006.01) |
| H03K 3/00 | (2006.01) |
| G06F 3/16 | (2006.01) |

(52) U.S. Cl.
CPC .............. G06F 1/08 (2013.01); H03K 3/00 (2013.01); H03K 21/08 (2013.01); *G06F 3/162* (2013.01)

(58) Field of Classification Search
CPC ............. G06F 1/08; H03K 3/00; H03K 21/08
USPC ......................................................... 327/199
See application file for complete search history.

(56) References Cited

U.S. PATENT DOCUMENTS 4,362,988 A * 12/1982 Weimer ............... G01R 19/255
324/601
5,907,699 A * 5/1999 Nakajima ................. G06F 1/04
713/501

* cited by examiner

*Primary Examiner* — Dinh T Le
(74) *Attorney, Agent, or Firm* — James M. Kasischke; Michael P. Stanley

(57) ABSTRACT

A sample clock source includes a master oscillator providing a square wave at a predetermined frequency. A counter and at least one flip-flop are joined to receive the square wave and produce several different output square waves having reduced frequencies. A selector is provided to allow user selection of the different square waves. The selected square wave is provided to a pulse generator which produces a pulse having a known duration at the selected reduced frequency. The pulse generator output can be buffered and provided as the sample clock source. The buffer amplifier is designed to drive long cables with sufficient stability a signal fidelity.

7 Claims, 4 Drawing Sheets

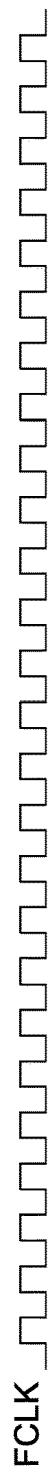
FCLK  FIG. 2A
FCLK/10  FIG. 2B
FCLK/20  FIG. 2C
FCLK/40  FIG. 2D

SAMPLE CLOCK SOURCE FOR DIGITAL DATA SYSTEMS

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

None.

BACKGROUND OF THE INVENTION

(1) Field of the Invention

The present invention is directed to a clock generator for digital data systems that is capable of driving multiple loads and long cables without becoming unstable.

(2) Description of the Prior Art

In a digital acoustic recording application, there was a need for a clock source to drive large banks of digital to analog (D/A) converters and analog to digital (A/D) converters. Researching available clock sources, researchers could not find portable or self-contained sample clocks that could be incorporated into a separate unit for this application. Existing clock sources provided a noisy, distorted waveform when driving a long cable combined with complex digital signal processing equipment. For this application, coaxial cables longer than about 10 feet are considered long cables because the inherent capacitance of coaxial cable introduces signal distortion.

Audio applications typically require a clock pulse frequency of 96 kHz as a standard. This standard is used to sample wideband audio at the Nyquist frequency range. As a frequency, 96 kHz is too low for practical crystals.

Thus, there is a need for a stable, self-contained clock pulse generator that can be applied to longer lines and multiple pieces of equipment.

SUMMARY OF THE INVENTION

It is a first object of the present invention to provide a clock pulse generator capable of producing a clock pulse at a frequency suitable for audio sampling applications.

Another object is to provide a clock pulse generator capable of producing a stable pulse when joined to long transmission lines and other circuitry Yet another object is to provide a frequency selectable clock pulse generator that can produce clock pulses at several user selectable frequencies.

Accordingly, there is provided a sample clock source including an oscillator providing a square wave at a predetermined frequency. A counter and at least one flip-flop are joined to receive the master oscillator square wave and produce several different output square waves having reduced frequencies. A selector is provided to allow user selection of the different square waves. The selected square wave is provided to a pulse generator which produces a pulse having a known duration at the selected reduced frequency. The pulse generator output can be buffered and provided as the sample clock source.

BRIEF DESCRIPTION OF THE DRAWINGS

Reference is made to the accompanying drawings in which are shown an illustrative embodiment of the invention, wherein corresponding reference characters indicate corresponding parts, and wherein:

FIG. 2A is a timing diagram showing the master oscillator output;

FIG. 2B is a timing diagram showing the highest square wave frequency output;

FIG. 2C is a timing diagram showing the intermediate square wave frequency output;

FIG. 2D is a timing diagram showing the lowest square wave frequency output;

DETAILED DESCRIPTION OF THE INVENTION

Figure 1:
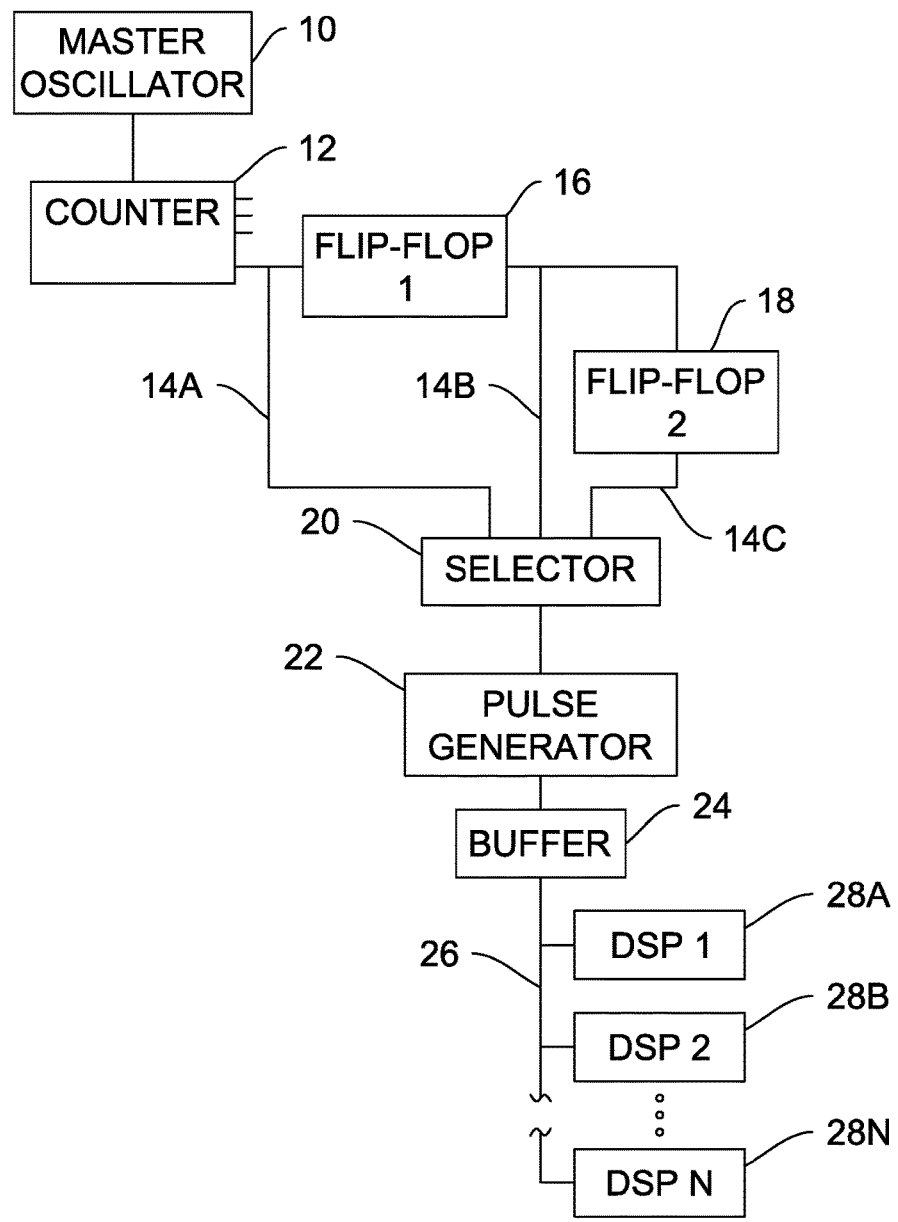
FIG. 1 is a block diagram of an embodiment of the invention.

FIG. 1 shows a block diagram of a circuit capable of producing a stable sampling clock pulse when joined to long cables and capacitive loads. An initial square wave is provided by stable radio-frequency oscillator 10. This square wave is received by counter 12. Counter 12 is of the type having a base number of outputs that are asserted sequentially on receiving a pulse. Counter 12 can be any kind of counter such as an octal counter or a decimal counter with the counter base being calculated to provide the desired frequency divisor. For example, an octal counter will provide a divisor of eight. Multiple counters could be connected in a chain to provide higher divisors. Counter 12 outputs could be joined to create divisors that are multiples of the base. Other logic such as flip-flops could be used to design a counter having a non-standard base. Counter 12 output can be used as a highest square wave frequency output 14A. Highest square wave frequency output 14A can be provided as input to a first flip-flop 16 for reduction by half at intermediate square wave frequency output 14B. Output 14B can be joined as input to a second flip-flop 18 for reduction by half again at lowest square wave frequency output 14C. Additional flip-flops could be provided in an alternate embodiment to continue dividing the output until a desired output frequency is achieved.

Outputs 14A, 14B, and 14C are joined to a selector 20 that can be switched to provide a selected output. Selector 20 can be a rotary selector switch, a plurality of jumpers, a plurality of dip switches or the like. Selected output from selector 20 is joined as input to a pulse generator 22. Pulse generator 22 can act on the rising edge or the falling edge of the input signal to generate a pulse output having a known duration at the selected frequency. A pulse output is commonly specified for driving analog to digital and digital to analog convertor board for digital signal processing. Pulse output from pulse generator 22 is joined to a buffer 24. Buffer 24 can be implemented as a line driver amplifier, a unity gain amplifier, or another amplifier having the desired characteristics. Buffer 24 output is joined to an output cable 26 which is joined to a plurality of devices such as first digital signal processor 28A, second digital signal processor 28B, and nth digital signal processor 28N. Buffer 24 allows cable 26 and devices to be joined to the buffer output without loading down the signal or causing instability. Buffer 24 can also include various resistors including a bias resistor and a load resistor. The bias resistor reduces the current drain and allows an adequate slew rate or rise time. The load resistor gives load stability and provides isolation from reactive loads. Output from buffer 24 can also be inverted by means known in the art.

FIGS. 2A, 2B, 2C, 2D, 3A, 3B, and 3C are timing diagrams showing the signal at various positions in the circuit of FIG. 1. FIG. 2A shows oscillator 10 output as square waves. Counter 12 divides oscillator 10 frequency by 10, giving FIG. 2B. This is shown after initialization so that multiple waves are provided. Only every tenth cycle is provided as output. FIG. 2B also provides the highest square wave frequency output 14A. FIG. 2C shows the output of first flip-flop 16. First flip-flop 16 output is asserted on receiving the first square wave of the highest square wave frequency output 14A, and it remains asserted until it receives the next sequential square wave rising edge. This results in intermediate square wave frequency output 14B. FIG. 2D shows the output of second flip-flop 18. Second flip-flop 18 is asserted after receiving the next sequential square wave edge of the intermediate square wave frequency output 14B. This output remains asserted until the second flip-flop 18 receives another rising edge trigger from flip-flop 16. The output from second flip-flop 18 is the lowest square wave frequency output 14C.

Figure 3A:
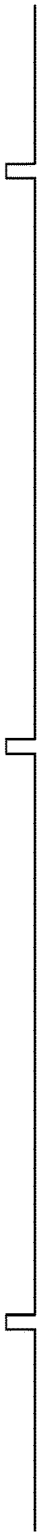
FIG. 3A is a timing diagram showing the pulse generator output from the selected highest pulse frequency output.
Figure 3B:
FIG. 3B is a timing diagram showing the pulse generator output from the selected intermediate pulse frequency output.
Figure 3C:
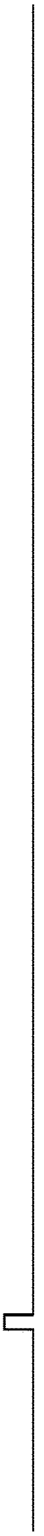
FIG. 3C is a timing diagram showing the pulse generator output from the selected lowest pulse frequency output.

FIGS. 3A, 3B, and 3C show the selected output from pulse generator 22. These outputs are shown based on rising edge triggering driving pulse generator 22. (Pulse generator 22 output pulses are active high.) FIG. 3A shows the output when the highest square wave frequency output 14A is selected at selector 20. FIG. 3B shows the pulse generator 22 output when the intermediate square wave frequency output 14B is selected, and FIG. 3C shows the output for the lowest square wave frequency output 14C.

Digital signal processors 28A, 28B, and 28N are shown for exemplary purposes. A large number of different devices can be provided for the application. As used herein, digital signal processor is a generic term for a variety of devices including analog to digital convertors, digital to analog convertors, processors forming Fourier transforms, encoders, decoders, digital filters, systems of these devices and the like.

In a preferred embodiment, prepared particularly for audio applications, the device is embodied on a printed circuit board with a voltage regulator to provide the +5 volts required for the circuits. A 1.92 MHz oscillator 10 such is utilized with a decade counter 12 to provide highest frequency output 14A at 192 kHz. In this embodiment, oscillator 10 is preferably a 5-volt unit having a stability of 20 ppm such as the HC13R8-001.92M oscillator made by Connor-Winfield Corp. A more accurate temperature-compensated crystal oscillator could be utilized in applications requiring greater accuracy. While a phase locked loop could be used instead of a crystal oscillator, these components add detrimental jitter and phase noise. First flip-flop 16 divides this to 96 kHz which appears at output 14B and second flip-flop 18 divides this to 48 kHz appearing at output 14C. These flip-flops can be Texas Instruments 74HC74 flip-flops.

Also in the preferred embodiment, pulse generator 22 is preferably a one-shot multivibrator such as the Texas Instruments SN74LVC1G123DCTT which can provide 1 μS (or narrower) pulses. Other logic families such as high speed CMOS may be incapable of generating pulses this narrow. Buffer 24 is embodied as an LT1206CT7 buffer amplifier manufactured by Linear Technology; however, a LT1210 line driver manufactured by Linear Technology can also be utilized. The preferred embodiment results in a 3"×5" board with a current drain of about 20 ma.

Figure 4:
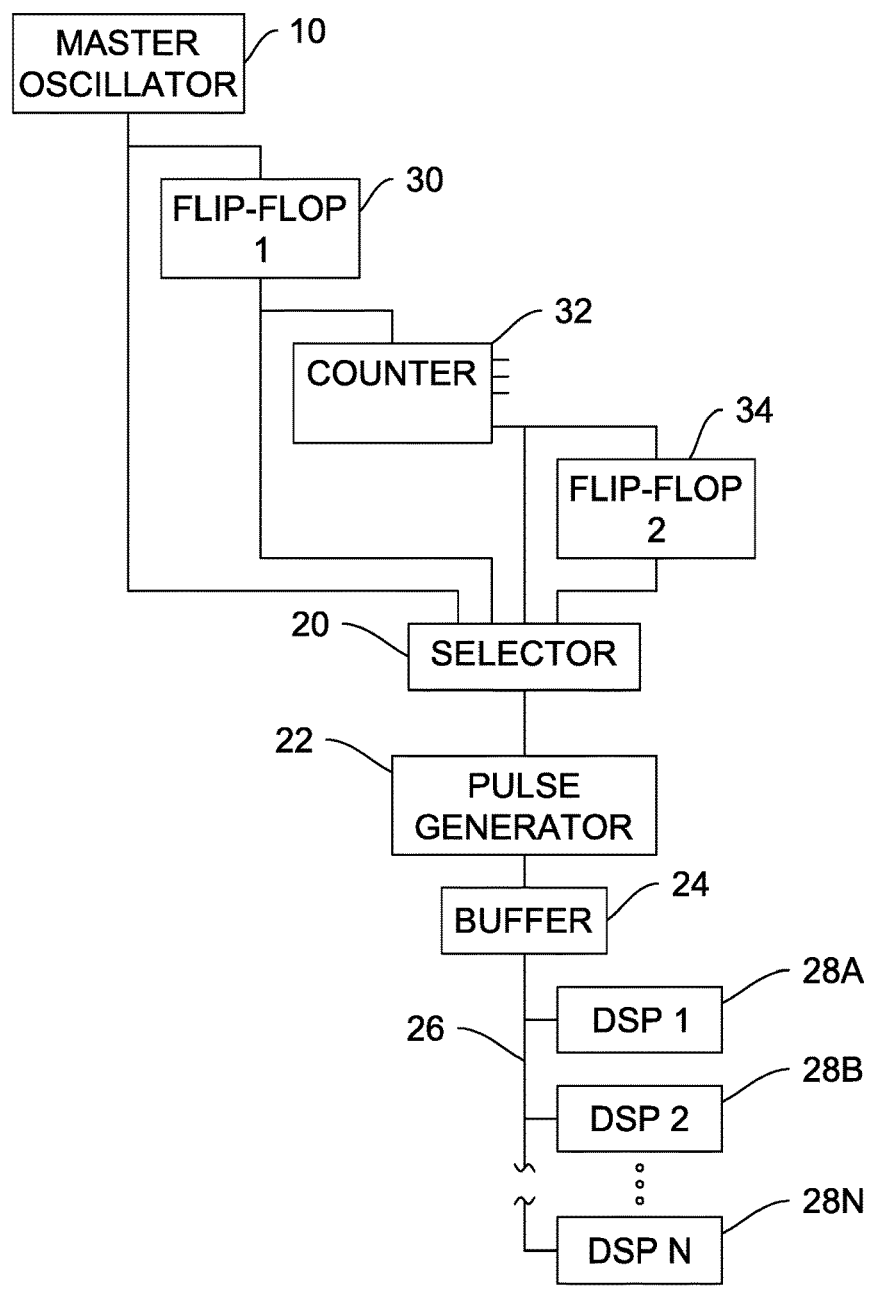
FIG. 4 is a block diagram of an alternate embodiment of the invention.

FIG. 4 shows an alternate embodiment in which components are positioned to give different output frequencies. Master oscillator 10 output can be joined to selector 20 and a first flip-flop 30. First flip-flop 30 reduces the square wave frequency by half at its output. First flip-flop 30 output is joined to counter 32 and selector 20. Counter 32 has a base number of outputs. One or more of these base number of counter outputs can be selected to provide a divided frequency square wave output. This divided output can be provided to selector 20. A second flip-flop 34 can be joined to receive counter 32 divided frequency square wave output. Second flip-flop 34 provides half of its input at a second flip-flop output thus producing an output square wave whose frequency is further divided by half. The second flip-flop 34 output is joined to selector 20. Thus, by arranging master oscillator 10, counter 32, first flip-flop 30, and second flip-flop 34, different ranges of square wave frequencies can be provided by selector 20.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive, nor to limit the invention to the precise form disclosed; and obviously, many modification and variations are possible in light of the above teaching. Such modifications and variations that may be apparent to a person skilled in the art are intended to be included within the scope of this invention as defined by the accompanying claims.

What is claimed is:

1. A sample clock source comprising:
   an oscillator having an oscillator output that can provide a square wave at a predetermined frequency;
   a digital counter having multiple digital counter outputs and a counter input in communication with said oscillator output to receive the square wave and to provide a reduced frequency square wave at a single counter output of the multiple digital counter outputs;
   a first flip-flop having a flip-flop input in communication with said single counter output to receive the reduced frequency square wave and to provide a half frequency square wave at a first flip-flop output;
   at least one additional flip-flop having an additional flip-flop input in communication with said first flip-flop output to receive the half frequency square wave and to provide a quarter frequency square wave at an additional flip-flop output;
   a selector having a plurality of selector inputs in communication with at least two of said single counter output, said first flip-flop output, and said additional flip-flop output, said selector having a selector output and a selector means selectably connecting one of the selector inputs to the selector output; and a pulse generator having a pulse generator output and a pulse generator input in communication with said selector output, said pulse generator producing a pulse having a known duration on receiving a state change at said pulse generator input whereby the pulse is provided as a sample clock source signal at said pulse generator output.

2. The apparatus of claim 1 further comprising a buffer having a buffer input in communication with said pulse generator output and a buffer output for providing a buffered sample clock source signal.

3. The apparatus of claim 2 wherein said buffer is a unity gain amplifier.

4. The apparatus of claim 1 wherein
in each said at least one additional flip-flop, said additional flip-flop input is in communication with another flip-flop output having a higher frequency, each said at least one additional flip-flop output providing a square wave having one half the frequency of said another flip-flop output, each at least one additional flip-flop output being in communication with an additional selector input of said plurality of selector inputs.

5. The apparatus of claim 4 further comprising a buffer having a buffer input in communication with said pulse generator output and a buffer output for providing a buffered sample clock source signal.

6. The apparatus of claim 5 wherein said buffer is a unity gain amplifier.

7. The apparatus of claim 4 wherein said digital counter is a decade counter.

* * * * *